United States Patent
Liu

(10) Patent No.: US 7,587,816 B2
(45) Date of Patent: Sep. 15, 2009

(54) METHOD OF IMPROVING THE STABILITY OF A CIRCUIT BOARD

(75) Inventor: Li Liu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 13 days.

(21) Appl. No.: 11/309,280

(22) Filed: Jul. 21, 2006

(65) Prior Publication Data

US 2007/0111595 A1    May 17, 2007

(30) Foreign Application Priority Data

Nov. 11, 2005    (CN) .................. 2005 1 0101244

(51) Int. Cl.
    *H01K 3/10* (2006.01)
(52) U.S. Cl. .................. 29/852; 29/825; 29/830; 29/832; 29/840
(58) Field of Classification Search .......... 29/825, 29/830, 832, 840, 852; 257/208

See application file for complete search history.

(56) References Cited

U.S. PATENT DOCUMENTS

| 4,443,278 | A | * | 4/1984 | Zingher ................ 156/64 |
| 4,578,279 | A | * | 3/1986 | Zingher ................ 427/10 |
| 5,282,312 | A | * | 2/1994 | DiStefano et al. .......... 29/830 |
| 5,367,764 | A | * | 11/1994 | DiStefano et al. .......... 29/830 |
| 5,558,928 | A | * | 9/1996 | DiStefano et al. .......... 428/209 |
| 5,570,504 | A | * | 11/1996 | DiStefano et al. .......... 29/830 |
| 5,640,761 | A | * | 6/1997 | DiStefano et al. .......... 29/830 |
| 6,000,129 | A | * | 12/1999 | Bhatt et al. .......... 29/852 |
| 6,115,262 | A | | 9/2000 | Brunner et al. |
| 6,388,208 | B1 | * | 5/2002 | Kiani et al. .......... 174/266 |
| 6,610,934 | B2 | * | 8/2003 | Yamaguchi et al. ........ 174/264 |
| 7,096,555 | B2 | * | 8/2006 | Tourne et al. .......... 29/402.06 |
| 2004/0173822 | A1 | * | 9/2004 | Dutta .......... 257/208 |

* cited by examiner

*Primary Examiner*—C. J Arbes
(74) *Attorney, Agent, or Firm*—Wei Te Chung

(57) ABSTRACT

A printed circuit board includes a mounting hole for receiving a connector pin of either of a first SMC and a second SMC, and a signal line. The signal line is electrically connected to the mounting hole by a conductive layer arranged in and about the mounting hole.

9 Claims, 5 Drawing Sheets

METHOD OF IMPROVING THE STABILITY OF A CIRCUIT BOARD

FIELD OF THE INVENTION

The present invention relates to a printed circuit board (PCB), and more particularly to a layout for mounting holes of a PCB.

DESCRIPTION OF RELATED ART

In general, surface mounted components (SMCs), including resistors, capacitors, inductors and so on, are mounted to a PCB by mounting holes. The mounting holes are arranged on the PCB in a matched relationship with connector pins of the SMCs. The mounting holes have different configurations due to varied configurations of the connector pins of the SMCs.

For example, two common SMCs are Universal Serial Bus (USB) port and Institute of Electrical and Electronics Engineers (IEEE) 1394 port. In designing a layout of a PCB it is common to include mounting holes for both USB and IEEE ports even though only one will be used at any given time. In Laying out a configuration for mounting holes of a PCB for mounting the USB port or the IEEE 1394 port, computer software such as Protel is used. Referring to FIGS. 2 to 4, typical configurations for mounting holes of the ports are designed and prepared in computerized layouts of a PCB. An area A that is part of a situation area 10 (FIG. 2) of the PCB for locating mounting holes of the IEEE 1394 port is similar to an area B that is part of a situation area 20 (FIG. 3) of the PCB for locating mounting holes of the USB port. For instance, the mounting hole 12 of the IEEE 1394 port is the same as the mounting hole 22 of the USB port. Therefore, when designing a layout of the PCB, the corresponding areas A and B may be superimposed to save space on the PCB (FIG. 4).

Referring to FIG. 5, in the design process, a centering point O1 of the mounting hole 12 for the IEEE 1394 port is supposed to be exactly aligned with the corresponding centering point O2 of the mounting hole 22 for the USB port. A signal line 40 is connected to the aligned centering points O1, O2 to complete the electrical connections of the two ports when needed. However, it is difficult in the manufacturing process to ensure the centering points O1, O2 are exactly aligned because of errors of design and manufacturing tools. Therefore, when the mounting holes are punched, misalignment in the centering holes will result in a misshapen mounting hole which may cause a gap between the mounting pin of a port and the signal line 40 resulting in an open circuit.

What is desired, therefore, is a PCB having mounting holes that can work normally even when a misalignment of centering holes occurs.

SUMMARY OF THE INVENTION

In one preferred embodiment, a PCB includes a mounting hole for receiving a connector pin of either of a first SMC and a second SMC, and a signal line. The signal line is electrically connected to the mounting hole by a conductive layer arranged in and about the mounting hole.

Other advantages and novel features will become more apparent from the following detailed description of preferred embodiments when taken in conjunction with the accompanying drawings, in which:

DETAILED DESCRIPTION OF THE INVENTION

Figure 1:
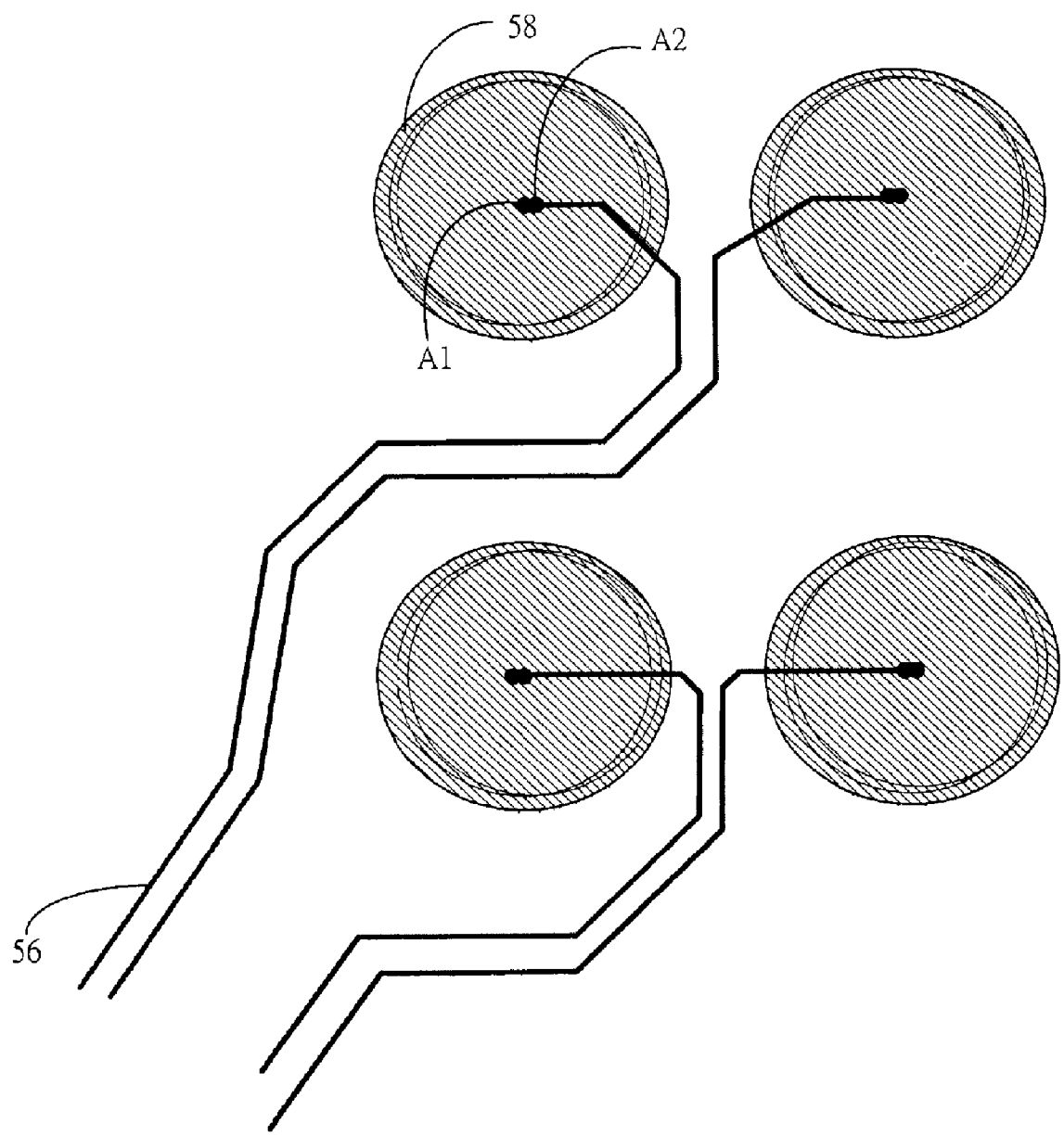
FIG. 1 is a schematic view of a computer generated layout of four mounting holes with conductive layers marked for punching with centering holes for fixing either one of an IEEE 1394 port and USB port of a PCB in accordance with a preferred embodiment of the present invention.
Figure 2:
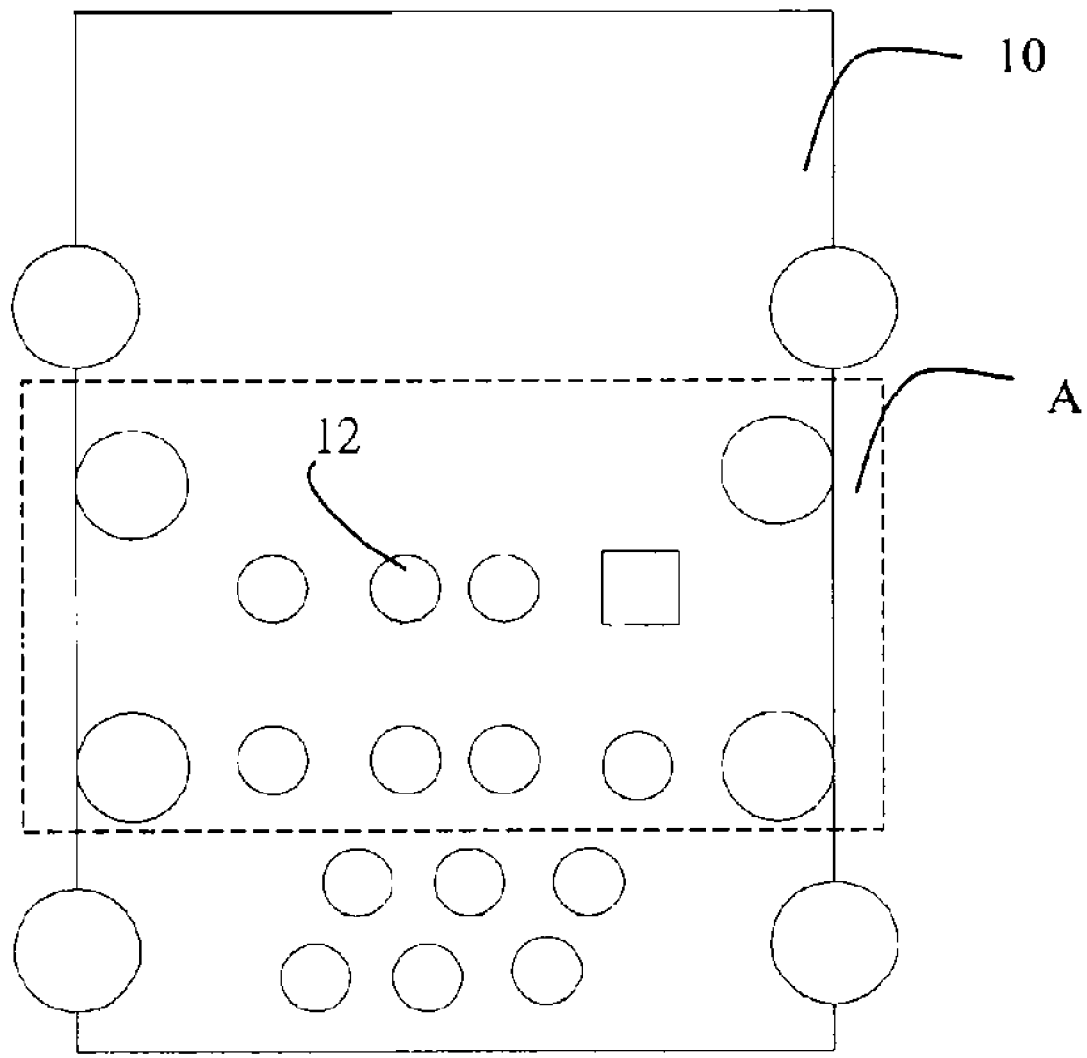
FIG. 2 is a schematic view of a computer generated layout of an area with mounting holes for fixing an IEEE 1394 port of a typical PCB.
Figure 3:
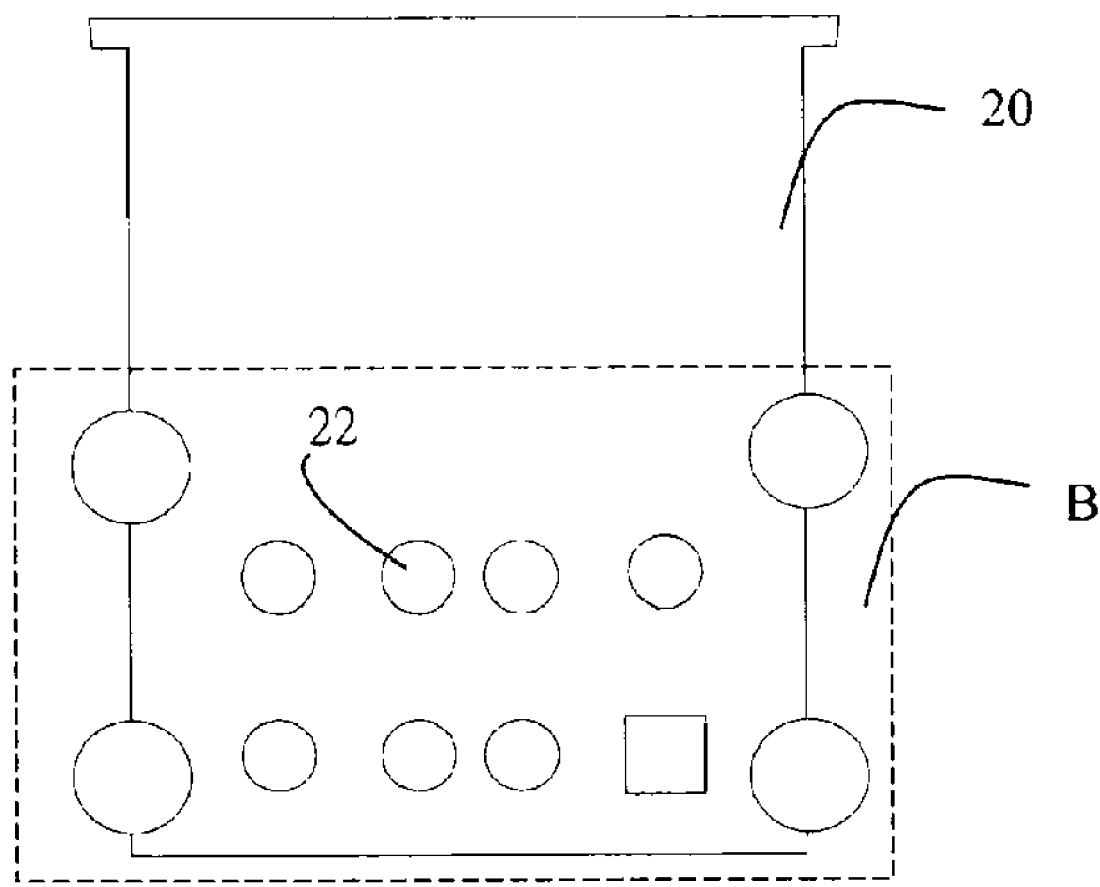
FIG. 3 is a schematic view of a computer generated layout of an area with mounting holes for fixing a USB port of a typical PCB.
Figure 4:
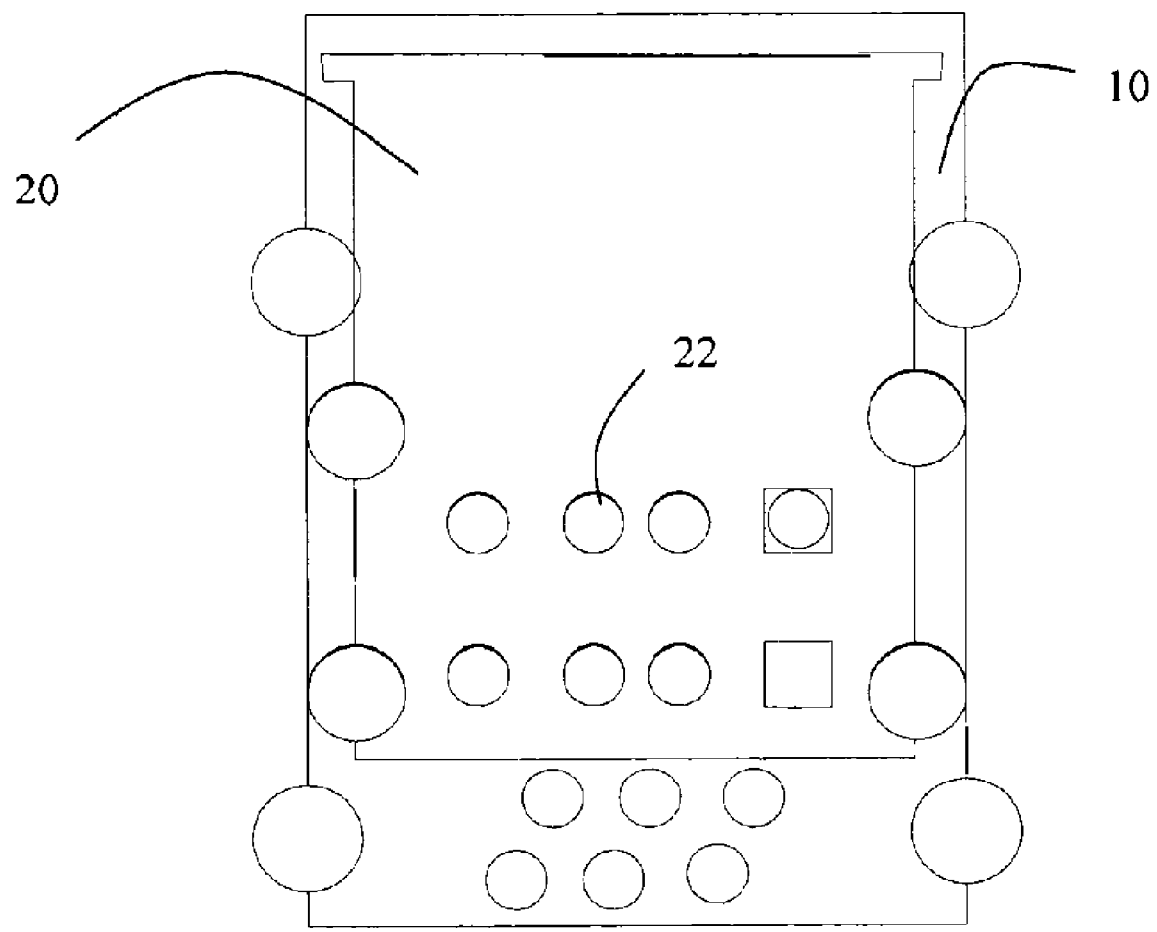
FIG. 4 is a schematic view of a computer generated layout combining the areas of FIG. 2 and FIG. 3 with mounting holes for fixing either one of IEEE 1394 port of FIG. 1 and USB port of FIG. 2 of a typical PCB.
Figure 5:
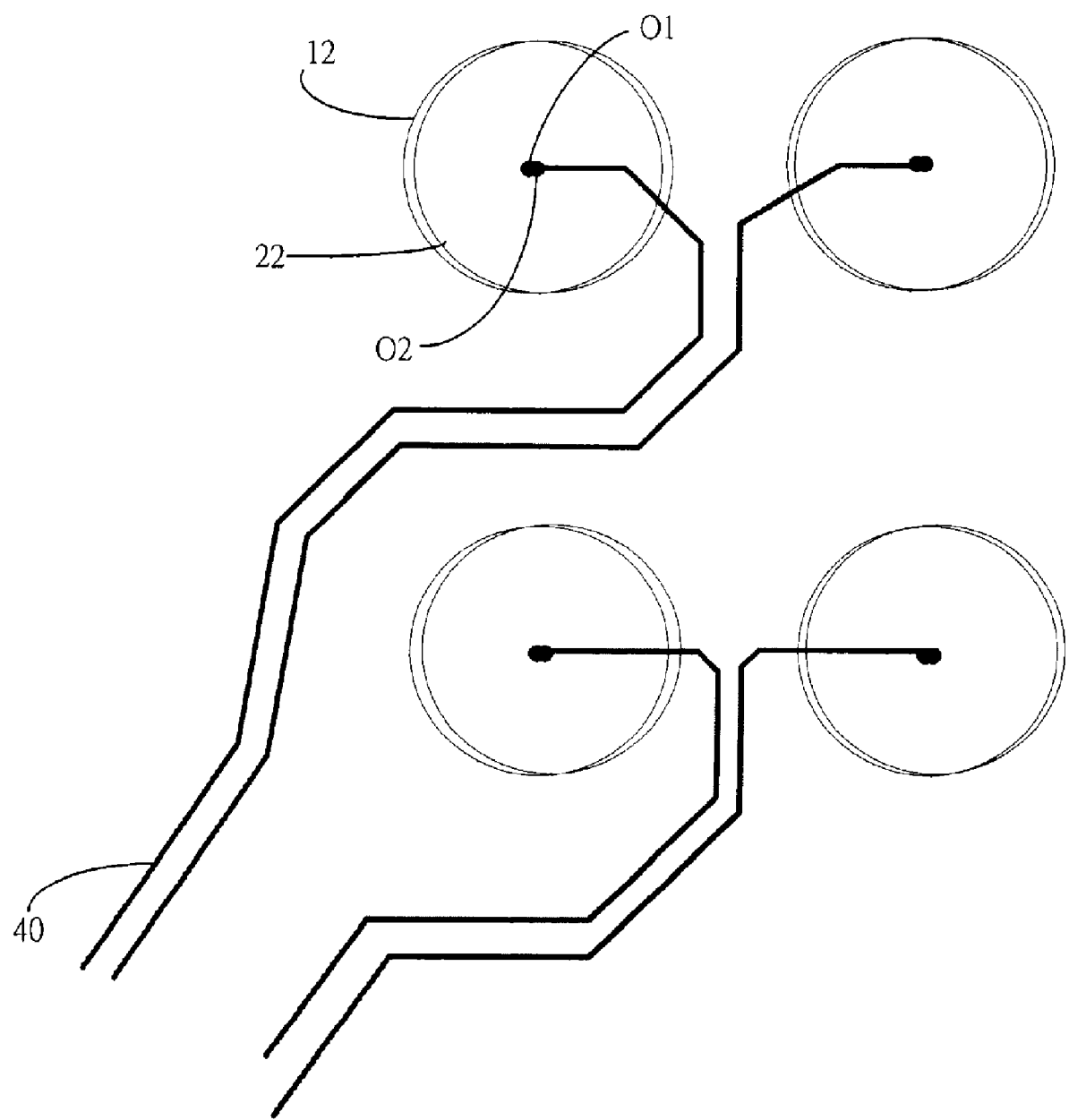
FIG. 5 is a schematic view of a computer generated layout of four mounting holes of FIG. 4 marked for punching with centering holes.

In a preferred embodiment of the present invention, a conventional layout for mounting holes (not labeled) of a circuit assembly like a printed circuit board (PCB) as shown in FIG. 4 is used, wherein a configuration of mounting holes for one surface mounted component (SMC) such as an Institute of Electrical and Electronics Engineers (IEEE) 1394 port is superimposed over a configuration of mounting holes for another SMC such as a Universal Serial Bus (USB) port. The configurations are superimposed in such way as to align as many of the mounting holes of both SMCs as possible for common use by pins of both SMCs. Then, as shown in detail in FIG. 1, a conductive layer (such as a copper foil) 58, having a generally circular shape is formed over each of the common mounting holes. A radius of each of the conductive layers is greater than a radius of the mounting holes thereunder to allow for any misalignment of centering points A1, A2. The centering points A1, A2 are for alignment of a punch apparatus during manufacturing of the PCB. A1 marks a center point for a mounting hole for the 1394 port and A2 marks a center point for a mounting hole for the USB port. Signal lines 56 are formed on the PCB each terminating at a center of a corresponding conductive layer 58.

During a process of punching holes in the PCB according to the layout described above, first one set of mounting holes is punched corresponding to the configuration for the 1394 port then another set of mounting holes is punched corresponding to the configuration for the USB port. The common holes will then have been punched twice, once for each set. When the common holes with the conducting layers 58 are punched, the conducting layers 58 do not punch cleanly. That is to say as the holes are punched in the PCB, the area of the conducting layers 58 pierced by the punching apparatus curls down and flattens against an upper portion of a circular sidewall defining each of the common mounting holes. Thus, even if a common mounting hole is misshapen due to misalignment of the two punches, a pin of the 1394 port or of the USB port received in the mounting hole will still form a closed circuit via the conductive layer lining the mounting hole with the signal line 56.

It is believed that the present embodiment and its advantages will be understood from the foregoing description, and it will be apparent that various changes may be made thereto without departing from the spirit and scope of the invention or sacrificing all of its material advantages, the example hereinbefore described merely being a preferred or exemplary embodiment.

What is claimed is:

1. A method for improving stability of a circuit assembly containing an integral substrate, comprising:
    forming a first mounting hole in said circuit assembly through said substrate for electrical connection of said circuit assembly with a first component via said first mounting hole;
    forming a second mounting hole in said circuit assembly through said substrate same as said first mounting hole for electrical connection of said circuit assembly with a second component different from said first component via said second mounting hole by partially, spatially merging said second mounting hole into said first mounting hole; wherein said first and second mounting holes are not coaxial; and
    placing a conductive layer on a same surface of said circuit assembly over said merged first and second mounting holes to complement any configuration difference between said first and second mounting holes so as to enhance said electrical connection of said circuit assembly with a selective one of said first and second components via said first and second mounting holes correspondingly.

2. The method as claimed in claim 1, wherein said placing step comprises covering said merged first and second mounting holes commonly with said conductive layer and punching said covering conductive layer to deform said conductive layer for complementing of said configuration difference.

3. The method as claimed in claim 1, wherein said first component is an Institute of Electrical and Electronics Engineers (IEEE) 1394 port, said second component is a Universal Serial Bus (USB) port.

4. The method as claimed in claim 1, wherein said conductive layer is made of copper foil, and has a generally circular shape.

5. The method as claimed in claim 4, wherein a radius of said conductive layer is greater than a maximum radius of said merged first and second mounting holes to allow any misalignment of centering points of said first and second mounting holes.

6. A method for improving stability of a printed circuit board (PCB), comprising:
    forming a first mounting hole on said PCB for electrically mounting a first component thereon;
    forming a second mounting hole on said PCB for electrically mounting a second component which is different from the first component thereon, a configuration of said first mounting hole superimposed over a configuration of said second mounting hole, said superimposed configurations capable of mounting one of said first and second components thereon according to need; and
    placing a conductive layer to cover said superimposed first and second mounting holes to complement any configuration difference between said first and second mounting holes so as to enhance electrical connection of said PCB with a selective one of said first and second components via said first and second mounting holes correspondingly.

7. The method as claimed in claim 6, wherein said first component is an Institute of Electrical and Electronics Engineers (IEEE) 1394 port, said second component is a Universal Serial Bus (USB) port.

8. The method as claimed in claim 6, wherein said conductive layer is made of copper foil, and has a generally circular shape.

9. The method as claimed in claim 8, wherein a radius of said conductive layer is greater than a radius of each of said superimposed first and second mounting holes thereunder to allow for any misalignment of centering points of said superimposed first and second mounting holes.

* * * * *

UNITED STATES PATENT AND TRADEMARK OFFICE
CERTIFICATE OF CORRECTION

PATENT NO. : 7,587,816 B2 Page 1 of 1
APPLICATION NO. : 11/309280
DATED : September 15, 2009
INVENTOR(S) : Li Liu It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 69 days.

Signed and Sealed this

Twenty-first Day of September, 2010

David J. Kappos
*Director of the United States Patent and Trademark Office*